United States Patent [19]

Wakefield

[11] 4,323,419
[45] Apr. 6, 1982

[54] METHOD FOR RIBBON SOLAR CELL FABRICATION

[75] Inventor: G. Felix Wakefield, Woodland Hills, Calif.

[73] Assignee: Atlantic Richfield Company, Los Angeles, Calif.

[21] Appl. No.: 147,765

[22] Filed: May 8, 1980

[51] Int. Cl.³ .................. B22D 11/06; H01L 31/18
[52] U.S. Cl. ................... 156/622; 164/461; 164/463; 427/86; 156/DIG. 88
[58] Field of Search ......... 164/86, 87, 97, 98, 164/106, 46, 423, 427, 429; 427/85, 86; 156/607, 622, DIG. 88, DIG. 64

[56] References Cited

U.S. PATENT DOCUMENTS

| | | | |
|---|---|---|---|
| 336,458 | 2/1886 | Weber | 164/231 |
| 2,931,082 | 4/1960 | Brennan | 164/88 X |
| 3,139,361 | 6/1964 | Rasmanis | 148/175 |
| 3,381,739 | 5/1968 | Hart | 164/64 |
| 3,742,585 | 7/1973 | Wentzell | 164/46 X |
| 3,776,297 | 12/1973 | Williford et al. | 164/86 |
| 4,086,952 | 5/1978 | Olsson | 164/88 |
| 4,142,571 | 3/1979 | Narasimhan | 164/88 |
| 4,159,354 | 6/1979 | Milnes et al. | 156/607 X |
| 4,233,338 | 11/1980 | Ricard et al. | 427/86 X |

*Primary Examiner*—Robert D. Baldwin
*Assistant Examiner*—K. Y. Lin

*Attorney, Agent, or Firm*—Nilsson, Robbins, Dalgarn, Berliner, Carson & Wurst

[57] ABSTRACT

A method and apparatus for casting material into a ribbon shape in which molten material to be cast is extruded in a thin ribbon onto a moving sheet of foil of a metal having a sufficiently lower melting point or which forms an alloy with the molten material which has a sufficiently lower melting point than the molten material, to cause almost immediate melting of at least a portion of the foil which comes in contact with the ribbon of molten casting material, with crystallization of the cast material occuring on a layer of liquified foil or foil-cast material alloy. Also disclosed is the disposing of the metal foil, in the vicinity of the contact with the ribbon of molten casting material, on a cooled surface which is moving past the region of extrusion of the molten material. The method and apparatus is disclosed to be particularly useful in making cast ribbon of semiconductor material with a foil backing and desirable properties for photovoltaic solar cell applications. In addition, it is disclosed to add dopant to the solidifying semiconductor material after extrusion onto the metal foil and/or to add dopant to the surface of the metal foil prior to contact with the molten material, and also to thermally control the rate of crystallization of the molten material.

13 Claims, 2 Drawing Figures

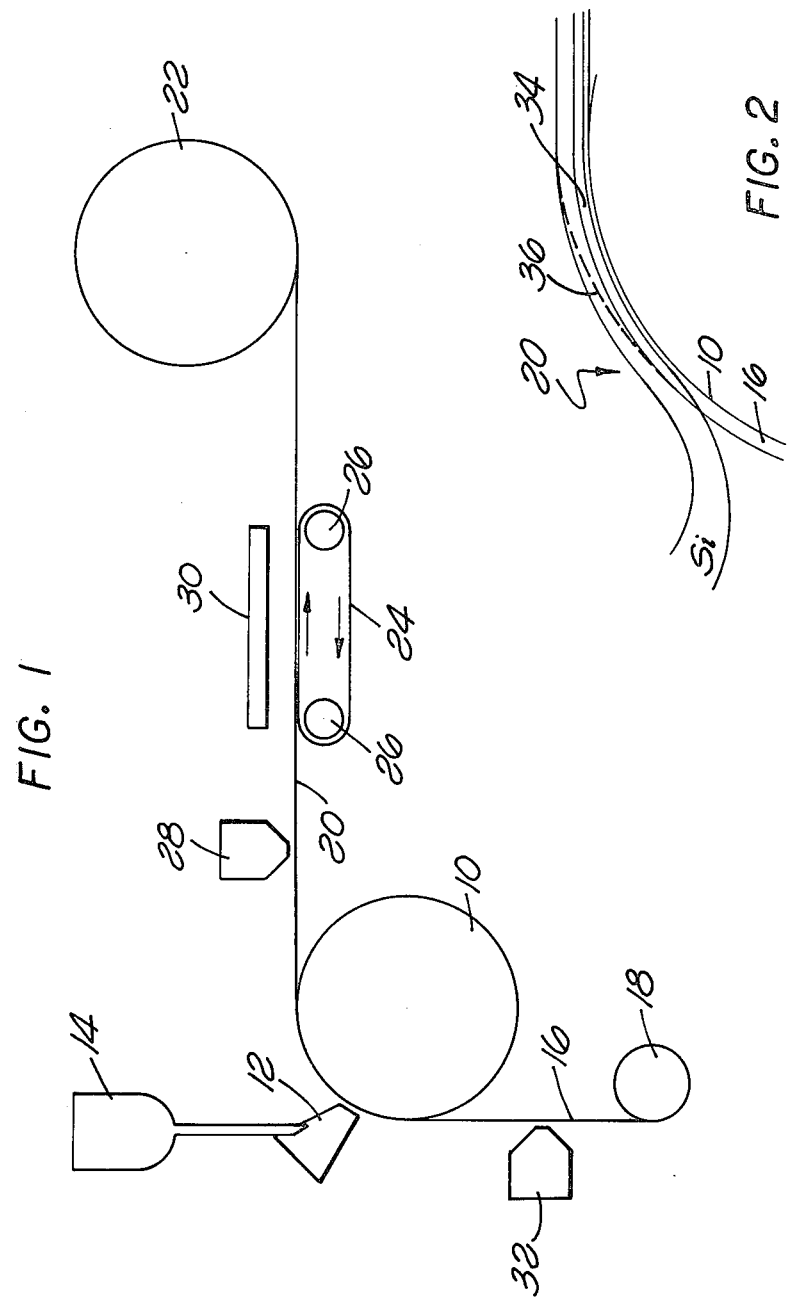

METHOD FOR RIBBON SOLAR CELL FABRICATION

RELATED APPLICATIONS

This application is related to co-pending Application Ser. No's. 147,804 and 148,319, in which the present inventor is a co-inventor.

BACKGROUND AND SUMMARY OF THE INVENTION

The casting of molten material, e.g., a metal or a semiconductor material like silicon, among others, into a ribbon shape has been shown to have feasibility, and in the case of semiconductor material to be particularly useful for forming photovoltaic solar cell starting material. The above-referenced applications, the disclosure of which are hereby incorporated by reference, relate to a method and apparatus for such ribbon casting and a tundish and the take-up apparatus useful in the ribbon casting apparatus and method. Cast ribbon photovoltaic cells have been shown to have up to a 5.25% efficiency and are thus useful in fabricating photovoltaic cells while decreasing the manufacturing cost of fabricating the silicon or other semiconductor material into a ribbon form useful for such photovoltaic cells.

The manufacture of the photovoltaic cells includes the further step of joining the ribbon of semiconductor material to a metal backing. It is desirable for purposes of reducing the cost of manufacture of such photovoltaic cells to reduce the number of steps in the fabricating process. It is also desirable to improve the contact and back surface field effect (BSF) of the union between the metal backing and the ribbon of semiconductor material. Casting of a liquid material onto a cold solid surface normally results in fine grain structure from the rapidly frozen material. It is desirable to achieve large grain material for higher cell efficiency, and therefore it is desirable to solidify the molten material onto a liquid surface which will have fewer grain nucleation sites. Further, the ribbon of semiconductor material, due to its crystalline structure, is both fragile and brittle. It is therefore desirable to form the union of the metal backing and the semiconductor ribbon simultaneously in order to both strengthen the resulting ribbon of combined semiconductor material and metal backing and to avoid processing steps in which the semiconductor ribbon alone, without the metal backing, must be further handled and processed or transported to another location for the further processing. The method and apparatus of the present invention is also useful in fabricating cast ribbon of bimetallic or trimetallic layers. The molten material, in this instance, is also a metal and the metal foil will melt when contacted by the molten material and, depending on the type of molten material and foil and the temperature of the molten material, will form a bimetallic ribbon of cast material on the foil backing or a trimetallic ribbon of cast material composed of a backing of the foil, a layer of an alloy of the foil and cast material and a layer of crystallized cast material.

In the past it has been known to fabricate a thin ribbon of semiconductor material, e.g., silicon, with a metal backing for photovoltaic solar cell applications by slicing a thin ribbon of semiconductor material from a solid stock of semiconductor material. Thereafter one surface of the ribbon is etched, e.g., with an acid or other chemical etchant, to remove any oxide of the semiconductor material from that surface and a small amount of the semiconductor material at the surface. A metal foil backing is then applied, as is known in the art, by any of a number of methods, e.g., vacuum evaporation or printing of a metal paste on the surface, which metal paste is heat sintered onto the surface. Such prior art methods are not susceptible to continuous fabrication of a continuous ribbon of the semiconductor material with the metal backing and necessitate handling of the ribbon between the slicing step and the addition of the metal backing.

The present invention relates to the method and apparatus for fabricating a cast ribbon which reduces or substantially eliminates the problems noted above. The invention relates to the casting of a ribbon of molten material, e.g., a metal or a semiconductor material like silicon, among others, into a ribbon of crystalline or coarse-grain polycrystalline cast material by extruding the molten material onto a cooled surface, as of a rotating drum, as is more fully explained in the above-referenced patent applications. In the method of the present invention, the surface of the rotating drum carries on it a thin foil of metal, e.g., aluminum, onto which the ribbon of molten material is extruded. The molten semiconductor material is of a temperature sufficiently greater than the melting temperature of the foil of metal such that at least some portion of the foil of metal, depending upon, inter alia, its melting temperature, the rate of cooling from the drum, and the thickness of the foil, will almost instantaneously melt when contacted with the molten material. As the rotating cooled surface of the rotating drum moves away from the region of extrusion of the molten ribbon, the molten ribbon will commence crystallization on the liquified metal foil surface and the portion of the metal foil which melted will solidify. Depending upon the type of molten casting material and foil and the temperature of the molten casting material, an alloy of the cast material and foil material may also form between the crystallized cast material and the solidified foil material.

Examples of the more important features of the present invention have thus been summarized rather broadly in order that a detailed description thereof that follows may be better understood and in order that the contribution to the art may be better appreciated. There are, of course, additional features of the invention that will be described hereafter and which will also form the subject of the appended claims. These other features and advantages of the present invention will become more apparent with reference to the following detailed description of a preferred embodiment thereof in connection with the accompanying drawing, in which:

BRIEF DESCRIPTION OF THE DRAWINGS

FIG. 1 shows a schematic view of the method and apparatus according to the present invention; and, FIG. 2 shows a cross-sectional view of the method and apparatus of the present invention in the region of contact between the foil and molten material to be cast and the resultant cast ribbon.

DETAILED DESCRIPTION OF A PREFERRED EMBODIMENT

Turning now to FIG. 1, an apparatus and method for the production of bi- or tri-layered cast ribbon, according to the present invention, is shown. Molten material, e.g., a metal or a semiconductor material like silicon, among others, is extruded onto the cooled surface of a metal foil 16 on a rotating cooled surface of a rotating drum 10 from a tundish 12, with the tundish 12 being supplied by a source 14 of molten material, all as is more fully explained in the Applicant's co-pending applications referred to above.

The surface of the rotating drum 10 in the vicinity of the tundish 12 carries, and thus also cools, a thin foil of metal 16 which is unwound from a supply drum 18 of the metal foil 16. The metal foil 16 is carried on the surface of the rotating drum 10 past an elongated narrow orifice (not shown) in the tundish 12, through which is extruded a ribbon of molten material, as is more fully explained in the Applicant's co-pending application filed under Ser. No. 148,804, May 8, 1980.

The thin foil 16 of metal comprises a metal, e.g., aluminum, which has a melting point significantly below that of the molten material to be cast, or which forms, with the molten material, an alloy having a sufficiently lower melting temperature than the molten material, so that at least a portion of the foil will almost immediately melt when contacted by the extruded ribbon of molten material. In the case of molten silicon and an aluminum foil backing, there results a molten aluminum or aluminum-silicon alloy surface disposed between the cooled surface of the rotating drum and the molten semiconductor material which will provide fewer grain nucleation sites than a solid surface would provide for the formation of crystals of the molten semiconductor material. In addition, the metal layer and the molten semiconductor ribbon, respectively, solidifying and crystallizing generally simultaneously, results in a penetration of the metal layer into the surface of the crystallized ribbon of semiconductor material or the formation of a semiconductor-metal alloy layer thereby improving the contacting and back surface field effect characteristics of the resultant solar cell ribbon over those known in the art having a metal backing on a ribbon of semiconductor material.

As the solar cell ribbon 20, composed of crystallizing semiconductor material and solidifying liquid metal (and possibly a semiconductor-metal alloy) is carried away from the region of extrusion of the ribbon of molten semiconductor material on the cooled surface of the rotating drum 10, the semiconductor ribbon crystallizes into a crystalline or coarse grain polycrystalline structure and the liquid foil metal (and semiconductor-foil metal alloy, if applicable) solidifies.

Since the molten semiconductor material has a significantly higher melting temperature than the foil material or the foil material-semiconductor material alloy, if applicable, the crystallization of the semiconductor material commences at the interface of the semiconductor material and the liquified foil material or liquified foil material-semiconductor material alloy, if applicable. The crystallization advances to the top of the layer of semiconductor material in a crystallization front 36, (shown in FIG. 2), as is known in the art, as the rotating drum 10 carries the ribbon 20 away from the point of contact of the molten ribbon extruded from the tundish 12 with the foil 16 on the surface of the drum 10. Crystallization of the semiconductor material at the interface of the semiconductor material and the liquified foil material or liquified foil material-semiconductor material alloy, occurs before the foil material or foil material-semiconductor material alloy, solidifies to the interface. Thus crystallization of the semiconductor material occurs on a liquid resulting in a crystalline or coarse-grain polycrystalline structure. As the molten semiconductor material is crystallizing, it is convenient to add dopant from a source of dopant such as an injector 28, disposed above the solar cell ribbon 20 in a region where the molten semiconductor material is still crystallizing. The injector 28, as is known in the art, directs the dopant, e.g., in the form of a gas, liquid, or solid towards the surface of the crystallizing semiconductor material, to penetrate the surface and be contained within the semiconductor material once crystallized. As the crystallization front 36 advances through the semiconductor material, some dopant will be rejected, improving the zone refinement, as is known in the art.

The solar cell ribbon is assisted in moving from the surface of the rotating drum 10 to a take-up reel 22 by the upper surface of a continuous conveyer 24 driven by conveyer drive wheels 26 and disposed adjacent the foil backing of the solar cell ribbon 20 and between the rotating drum 10 and the take-up reel 22, to support and assist the solar cell ribbon 20 in transiting between the rotating drum 10 and the take-up reel 22.

Also shown in FIG. 1 is a solidification thermal control unit 30 disposed above the solar cell ribbon 20 in a region where crystallization of the molten semiconductor material, and solidification of the melted portion of the foil (as well as the semiconductor-foil alloy, if applicable) is occurring. The location and type of thermal control depends upon such factors as, e.g., the type of semiconductor material, the thickness of the ribbon of semiconductor material, the desired crystalline properties of the semiconductor ribbon and the precise location of the solidification thermal control. The solidification thermal control may, therefore, constitute a heating unit, a cooling unit, or a combination of heating and cooling, in different locations along the travel of the solar cell ribbon 20, comprising the semiconductor material and the metal backing (and possibly the semiconductor-metal alloy), between the point of extrusion of the ribbon of molten semiconductor material and the take-up reel. The specifics of the solidification thermal control unit 30 form no part of the present invention, with the exception of the recognition that it may be desirable to control, i.e., to accelerate or to decelerate, the rate of crystal formation in the crystallizing semiconductor material portion of the solar cell ribbon 20 at some point or points after the molten semiconductor material ribbon is extruded onto the cooled surface of the rotating drum 10 to achieve desired properties in the semiconductor film. Of course, the cooled surface of the rotating drum 10 will cause the initiation of crystallization. However, more precise control of the crystallization process can be obtained by control of heat removal by adding or removing heat as the ribbon passes away from the point of extrusion, by means other than the cooled surface of the drum 10. Thus, the solidification thermal control 30 disposed apart from the cooled surface of the rotating drum 10 may be necessary. In addition, the solidification thermal control unit 30 is shown to be separated from and downstream of the source 28 of dopant deposited into the crystallizing semiconductor ribbon. This is intended for schematic illustration only and, in fact, to control the depth and profile of the doped surface of ribbon 20, the dopant may be supplied from a source 28 of dopant in a region where the solidification thermal control 30 is acting upon the solar cell ribbon 20, to speed up or slow down the rate of crystallization of the molten semiconductor ribbon portion of the solar cell ribbon 20. The source 28 may also be disposed so the dopant is deposited in a region where the solidification thermal control 30 is not acting upon the solar cell ribbon 20 and downstream, in the direction of travel of the solar cell ribbon 20 from the rotating drum 10 to the take-up reel 22, of some portion or all of the solidification thermal control 30.

FIG. 2 illustrates the manner in which the apparatus and method of the present invention functions in the particular application of fabricating a continuous ribbon of cast solar cell material having an aluminum backing upon which is solidified an alloy of the aluminum and semiconductor material, as illustrated silicon, and with a crystalline or coarse-grain polycrystalline layer of the semiconductor material, i.e., silicon.

The ribbon of silicon semiconductor material leaves the tundish 12 (not shown in FIG. 2) in a molten form and is drawn by surface tension and adhesion onto the cooled surface of the rotating drum 10 by the portion of the ribbon 20 which has already begun crystallization, or been crystallized. The cooled surface of the drum 10 has upon it a foil 16 of, e.g., aluminum. As the silicon contacts the upper surface of the aluminum foil 16, melting of the upper portion of the foil 16 occurs. The heat removal, through the cooled surface of the drum 10 and any portion of the solidification thermal control 30 in the vicinity of the contacting point, may be controlled so that all of the thickness of the foil 16 does not melt. The absolute heat capacity of the foil 16 to absorb heat, without entirely melting, which depends on, e.g., the foil 16 thickness and material, will preferably not be exceeded. Thus the foil 16 will only melt in a layer on top of the metal foil 16 with a layer of solid metal foil 16 disposed between the molten foil layer and the drum 10 surface. Other factors besides the foil 16 heat capacity and thickness which affect whether the entire foil 16 melts, are the heat content in the ribbon of molten material, the speed with which the drum 10 moves the molten material away from the heat source in the tundish 12, and, as noted above, the rate of heat removal by the drum 10 and solidification thermal control 30.

In the case where the molten material to be cast is silicon, it is maintained in the tundish 12 at about 25°–50° C. above the melting temperature for silicon of 1420° C. As silicon and aluminum will form an alloy which melts well below 1420° C. and solidifies at above the temperature at which aluminum will solidify, a layer 34 of silicon-aluminum alloy, is formed as the melted portion of the foil 16 solidifies along with the crystallization of the silicon. If the heat removal is adjusted to be principally from the removal through the cooled surface of the drum 10, the lower level of the silicon, at the silicon-aluminum alloy-silicon interface, will begin crystallization first and crystallization will progress upwardly through the silicon layer. In addition, more heat removal occurs as the ribbon 20 moves further from the tundish 12 on the surface of the drum 10. Thus solidification will progress through the silicon layer in an inclined wave front 36, as is known in the art. The silicon-aluminum alloy layer, having a melting temperature well below the crystallization temperature of the silicon, will provide a layer of liquid on which the crystallization of the silicon commences. The crystallization of the silicon commencing at the silicon-alloy interface well above the temperature for solidification of the alloy, insures that the crystallization of the silicon will commence on a liquid layer. Thus nucleation sites for grains of the silicon are substantially eliminated with comparison to the number of such sites which would exist on a solid surface. This, along with a relatively slow rate of crystallization, will result in desirably large (coarse) grained crystals being formed in the semiconductor material layer.

One advantageous result of the present method and apparatus is that, where the metal foil is of a "p" type dopant and the semiconductor is a "p" type semiconductor, the alloy forms a p+ layer resulting in improved operation of the cell due to back surface field effect. Other "p" dopants could be used alone or may be added to the surface of the aluminum, e.g., by spraying from a source 32 (shown in FIG. 1) of the dopant, e.g., boron. It may also be desirable to have an n+ back surface field effect in an "n" type semiconductor material. Since "n" type dopants, e.g., phosphorous or arsenic, are not typically available in foil form, they may be sprayed onto the surface of a neutral metal foil, e.g., silver, prior to contact with the molten semiconductor material of the "n" type which is to be cast into a ribbon on the foil.

SUMMARY OF THE ADVANTAGES AND SCOPE OF THE INVENTION

It will be understood that in an apparatus and method according to the present invention, certain significant advantages are obtained.

For example, melting of the metal surface of the metal strip as the ribbon of molten material contacts the strip allows for control of the grain size and properties of the cast ribbon by control of nucleation of the grains of the cast material on a liquid. Further, penetration of the metal into the adjacent crystallizing ribbon of cast material, as both the cast ribbon and the foil metal, respectively, crystallize and solidify, results in better contact between the foil metal, or foil material-cast material alloy, and the cast material and, in the case where the cast material is a semiconductor, a better back surface field effect for the ribbon solar cell. The fabrication of ribbon solar cell, with the metal backing placed on the ribbon of crystalline or coarse-grain polycrystalline semiconductor material at the same time as the ribbon is crystallizing, facilitates the handling of the fragile semiconductor ribbon, having a crystalline structure, and eliminates an additional step which must be carried out with the ribbon alone, i.e., placing the metal backing on the ribbon. Therefore, the likelihood of the ribbon cracking or breaking during the process of fabricating a ribbon solar cell is significantly diminished. Further, a better junction is formed by crystallizing the semiconductor material into the surface of the metal foil due to the generally simultaneous crystallization of the semiconductor material and solidification of the foil metal, or foil metal-semiconductor alloy, after the molten semiconductor material causes the foil metal, or at least a portion of the foil metal containing the molten semiconductor material, to melt. In addition, etching steps necessary to clean the semiconductor surface before placing a metal backing on the semiconductor ribbon, in the fabrication of ribbon solar cells, as is known in the art, are eliminated by the method and apparatus according to the present invention.

The method and apparatus according to the present invention provides a high volume low cost method and apparatus for fabrication of a bi-layered or tri-layered material, e.g., a ribbon solar cell having a metal backing, from a molten ribbon of material and a solid foil of material, in a continuous process with the metal backing being placed onto the ribbon of crystallized cast material, e.g., semiconductor material, as the cast ribbon is crystallized from a molten state.

The foregoing description of the invention has been directed to a particular preferred embodiment in accordance with the requirements of the Patent Statutes and for purposes of explanation and illustration. It will be apparent, however, to those of ordinary skill in this art that many modifications and changes in both the apparatus and method of the present invention may be made without departing from the scope and spirit of the invention. For example, while the preferred embodiment is a method and apparatus for the continuous fabrication of a ribbon of semiconductor material on a metal backing for photovoltaic solar cell application, as noted above, the invention is also applicable for the fabrication of bi- or trimetallic ribbons in which the cast material is also a metal and it is desirable to control the crystallization of the cast metal by providing a liquid surface upon which the casting occurs. It will further be apparent that the invention may also be utilized with suitable modifications within the state of the art, which will be apparent to those skilled in the art. It is the Applicant's intention in the following claims to cover all such equivalent modifications and variations as fall within the true spirit and scope of the invention.

What is claimed is:

1. A method of casting a ribbon of crystallized material on a metal backing or a backing having a metal layer and a layer of cast material-metal alloy, comprising:
    extruding, at a region of extrusion, a ribbon of the material to be cast in a molten form onto an elongated strip of metal foil, drawn past the region of extrusion on a cooled surface moving past the region of extrusion, the ribbon of molten material having a form, and the metal of the foil having a melting point or forming with the molten material to be cast an alloy having a melting point, sufficiently below that of the molten material to be cast, so that at least a sufficient portion of the metal of the foil contacted by the molten material to be cast will melt, or form a melted alloy with the molten material to be cast, to provide a liquid layer upon which crystallization of the molten material to be cast occurs in conjunction with solidification of the material of the liquid layer.

2. The method of claim 1 wherein crystallization of the molten material to be cast, after contact with the metal foil, results in a high perfection junction by crystallizing into the surface of the provided liquid layer, as the molten material to be cast cools and crystallizes and the material of the provided liquid layer solidifies.

3. A method of casting a ribbon of cast semiconductor material on a metal backing, or a backing having a metal layer and a layer of semiconductor-metal alloy, comprising:
    extruding, at a region of extrusion, a ribbon of molten semiconductor material onto an elongated strip of metal foil carried past the region of extrusion on a cooled surface moving past the region of extrusion, the ribbon of molten material having a form, and the metal having a melting point or forming with the semiconductor material an alloy having a melting point, sufficiently below that of the semiconductor material, so that at least a sufficient portion of the metal of the foil will melt or form a melted foil metal-semiconductor alloy, to provide a liquid layer upon which crystallization of the semiconductor material occurs in conjunction with solidification of the material of the liquid layer.

4. The method of claim 3 wherein crystallization of the molten semiconductor material after contact with the metal foil results in a high perfection junction by crystallizing into the surface of the provided liquid layer, as the molten semiconductor material cools and crystallizes and the material of the provided liquid layer solidifies.

5. The method of claim 3 or 4 wherein dopant is added to the crystallizing semiconductor material.

6. The method of claim 3 or 4 wherein sufficient melting occurs of the metal in the foil to substantially eliminate nucleation sites for nucleation of crystals of the semiconductor material.

7. The method of claim 1 in which the crystallization of the molten material to be cast commences at the surface of the liquid layer.

8. The method of claim 3 in which the crystallization of the semiconductor material commences at the surface of the liquid layer.

9. A method of casting a ribbon of crystallized material on a metal backing or a backing having a metal layer and a layer of cast material-metal alloy, comprising:
    extruding, at a region of extrusion, a ribbon of the material to be cast in a molten form onto an elongated strip of metal foil, drawn past the region of extrusion on a cooled surface moving past the region of extrusion, the ribbon of molten material having a form, and the metal of the foil having a melting point or forming with the molten material to be cast an alloy having a melting point, sufficiently below that of the molten material to be cast, so that, due to heat from the molten material, at least a sufficient portion of the metal of the foil contacted by the molten material to be cast will melt, or form a melted alloy with the molten material to be cast, to provide a liquid layer upon which crystallization of the molten material to be cast occurs in conjunction with solidification of the material of the liquid layer.

10. The method of claim 9 wherein during the melting to provide the liquid layer at least a sufficient portion of the metal of the foil remains unmelted to provide a solid layer under the liquid layer.

11. A method of casting a ribbon of cast semiconductor material on a metal backing, or a backing having a metal layer and a layer of semiconductor-metal alloy, comprising:
    extruding, at a region of extrusion, a ribbon of molten semiconductor material onto an elongated strip of metal foil carried past the region of extrusion on a cooled surface moving past the region of extrusion, the ribbon of molten material having a form, and the metal having a melting point or forming with the semiconductor material an alloy having a melting point, sufficiently below that of the semiconductor material, so that, due to heat from the molten material, at least a sufficient portion of the metal of the foil will melt or form a melted foil metal-semiconductor alloy, to provide a liquid layer upon which crystallization of the semiconductor material occurs in conjunction with solidification of the material of the liquid layer.

12. The method of claim 11 wherein during the melting to provide the liquid layer at least a sufficient portion of the metal foil remains ummelted to provide a solid layer under the liquid layer.

13. The method of claim 11 wherein the semiconductor material comprises silicon and the metal foil comprises aluminum.

* * * * *